Dec. 8, 1964 W. F. LOOTENS ETAL 3,160,798

SEMICONDUCTOR DEVICES INCLUDING MEANS FOR SECURING THE ELEMENTS

Filed Dec. 7, 1959

INVENTORS:
JOSEPH K. FLOWERS,
WILLIAM F. LOOTENS,

BY Julius J. Zaskalicky
THEIR ATTORNEY.

United States Patent Office 3,160,798

Patented Dec. 8, 1964

3,160,798

SEMICONDUCTOR DEVICES INCLUDING MEANS FOR SECURING THE ELEMENTS

William F. Lootens, Skaneateles, and Joseph K. Flowers, North Syracuse, N.Y., assignors to General Electric Company, a corporation of New York Filed Dec. 7, 1959, Ser. No. 857,593
6 Claims. (Cl. 317—234)

This invention relates to semiconductor devices and, in particular, to silicon asymmetrically conductive devices of the junction type having large current carrying capabilities.

One form of such asymmetrically conductive device is a high current rectifier. The active elements referred to as the rectifying sandwich of one such rectifier device consists of a wafer of N-type conductivity silicon semiconductor material with a layer of aluminum and a backing plate usually of molybdenum or tungsten on one side and with a layer of antimony-doped gold and a similar backing plate on the other side thereof. The entire sandwich is heated for a time and temperature to cause the aluminum and gold-antimony to fuse the entire sandwich together. The rectifying sandwich is then mounted on a suitable mounting block which in turn forms one of the external electrical terminals of the rectifier and at the same time provides means for removal of heat generated in the silicon semiconductor material. Suitable connection is made to the other backing plate to form the other external terminal of the rectifier. As the gold-antimony solder used in securing the silicon semiconductor body to the backing plate has a low melting temperature, it is essential in making subsequent solder connections that this temperature not be exceeded, otherwise the properties of the rectifying sandwich are impaired. For this reason it has been usual to secure one backing plate of the sandwich to the mounting block by means of a soft solder, such as lead or tin. It has been found, however, under repeated use in which the device is in and out of circuit many times over a period of time that the soft solder contact becomes impaired and the usefulness of the rectifier is destroyed. This is usually manifested as an increase in the thermal impedance of the rectifier.

The present invention is directed to the provision of a solder contact for such a purpose which overcomes the disadvantages of the heretofore conventional solders used for this purpose.

An object of the present invention is to provide an improved rectifying device which will withstand greater thermal, electrical and mechanical strains than heretofore possible.

In carrying out this invention in one form as applied to a semiconductor device, there is provided a body of silicon semiconductor material, a contact member having a coefficient of expansion comparable to the coefficient of expansion of the silicon and on which the silicon body is mounted, and a mounting block to which the backing plate is mounted by means of a solder consisting of essentially eighty percent gold and twenty percent tin.

These and other advantages of this invention will be more clearly understood from the following description taken in connection with the accompanying drawings and its scope will be apparent from the appended claims.

Figure 1:
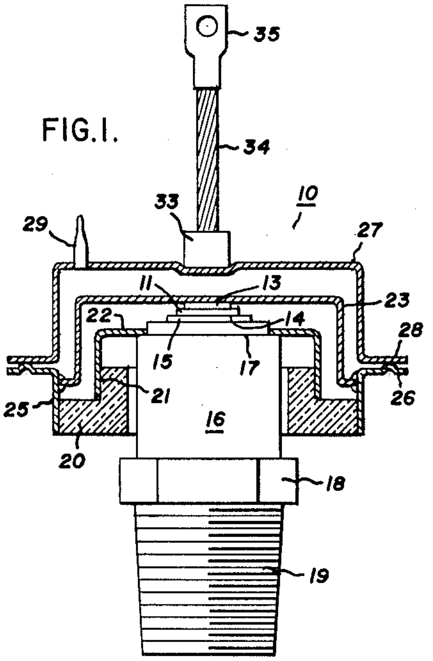
FIGURE 1 is an elevational view in section of a high current semiconductor rectifier constructed in accordance with the present invention.

Referring now to FIGURE 1, a semiconductor junction-type rectifier is shown mounted in a sealed, self-contained unit which is referred to generally by the reference character 10. In this embodiment the active elements of the rectifier referred to as the rectifying sandwich consists of a monocrystalline wafer or pellet of N-type silicon semiconductor material 11 with a layer of aluminum 12 and a backing plate 13 of tungsten on one side thereof and with a layer 14 of antimony-doped gold and a similar backing plate 15 on the other side thereof. The entire sandwich is heated for a time and temperature, to be explained in greater detail below, to cause the aluminum and gold to fuse the entire sandwich together. Plates 13 and 15 are preferably made of molybdenum, tungsten or base alloys thereof since these materials and silicon have similar thermal coefficients of expansion. By providing the plates with similar coefficients of expansion, the silicon pellet is protected from extraneous pressures created by temperature differentials when the device is being fabricated or utilized in an operating circuit. The entire rectifying sandwich, which consists of the aforementioned elements, is mounted on a copper base provided by the stud 16 by means of a gold-tin solder consisting essentially of eighty percent gold and twenty percent tin in a manner to be described in detail below.

Stud 16 is provided with an annular shelf 17 on the upper extremity thereof, the hexagonal nut 18 in the central portion thereof and a tapered thread 19 on the lower portion thereof. The stud 16 is mounted to a ring 25 of steel or other suitable material which forms a portion of the casing for unit 10 through the combination of an annular ceramic insulator 20 and an annular clip 22. The clip is adapted to be received on the shelf 17 of stud 16 and upon the annular shelf 21 of ceramic 20. Clip 22 is characterized by having a temperature coefficient of expansion similar to that of the ceramic 20 and may be made of cold rolled steel or a variety of iron, nickel and cobalt alloys, having a coefficient of expansion comparable to that of ceramic materials such as fernico. Ceramic 20 may be secured to steel ring 25 and to clip 22 by silver brazing to a metalized surface on the ceramic applied by the process of moly-manganese metalizing on the ceramic which is well known in the art and is shown and described, for example, in Patent 2,667,432, U.S. patent of Nolte, which is assigned to the assignee of this invention. A resilient contact clip 23 is secured to plate 13 and to ring 25.

A cup-shaped casing member 27, of steel or other suitable material, which has flanged end portions 28 thereon, is sealed to the flanged end portions 26 of ring 25. A collar 33 is mounted on cup 27 and receives a flexible cable 34 having a terminal 35. Cup 27 is also provided with an exhaust tube 29 which may be used to test for leaks in the sealed unit or may be used to control the ambient conditions in the sealed area. When this has been accomplished, the tube is pinched off and sealed.

Figure 2:
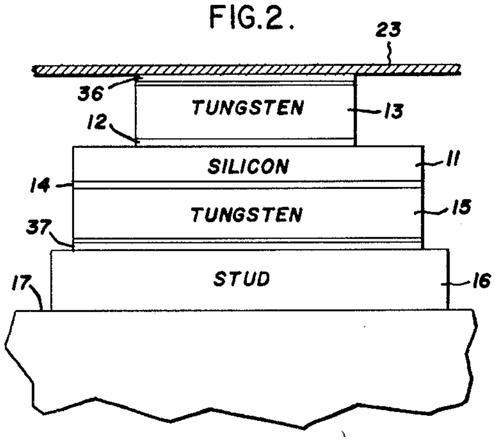
FIGURE 2 is an elevational view in section of the active rectifying elements of the rectifier.
Figure 3:
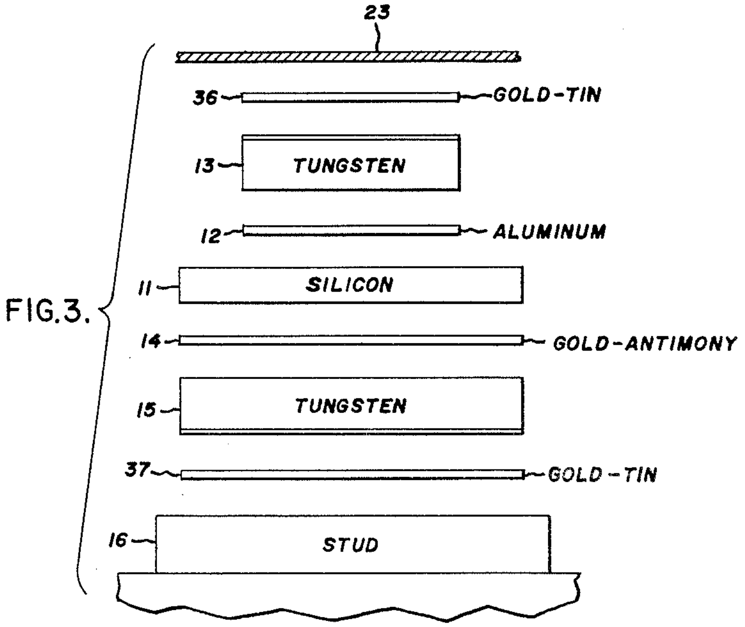
FIGURE 3 is an exploded elevational view in section of the active rectifying elements of the rectifier, particularly showing the manner of mounting the rectifying sandwich to a base mounting plate.

Referring now to FIGURE 2, there is shown an elevation view in section of the rectifying sandwich with portions of the external connections. FIGURE 3 shows in exploded view the elements forming the section of FIGURE 2. In connection with these figures, the materials making up the rectifying sandwich and its manner of connection to external leads will be described. The silicon semiconductor wafer 11 is of N-type conductivity with a resistance of about twenty ohm-centimeters. The wafer has a diameter of approximately .375 inch and a thickness of approximately seven mils (thousandths of an inch). On one side of the wafer is positioned an aluminum disc 12 approximately .312 inch in diameter and three mils thick. Above the aluminum disc is situated a plate of tungsten 13 which has been suitably cleaned. The tungsten disc has a diameter of approximately .312 inch and a thickness of approximately .020 inch. The side of the tungsten plate adjacent the aluminum is clean and the other side is coated with silver. On the other side of the wafer is positioned a disc 14 of gold-antimony, approximately ninety-nine percent gold and one percent antimony, having a diameter of .375 inch and a thickness of .003 inch. Below the gold antimony disc is situated a tungsten plate 15 similar to tungsten plate 13, having a diameter of .375 inch and a thickness of .020 inch. The side of the tungsten plate adjacent the gold-antimony disc is clean and the other side is coated with silver.

In the fabrication of the elements described, they are stacked together as indicated and passed through a tunnel oven, the peak temperature of which is approximately 750° C. It takes about fifty minutes for the sandwich to be elevated from room temperature 25° C. to the peak temperature. The sandwich is held at peak temperature for about three minutes and then allowed to cool to room temperature in about two hours. In this operation the aluminum is fused to the silicon to form a P-N junction therein and at the same time the silicon is fused to the tungsten backing plate. Similarly, the gold-antimony disc fuses the tungsten backing plate to the N-type silicon wafer to form a good ohmic contact therewith.

The sandwich is next secured to lower and upper external terminals in the manner to be described. As the antimony-gold-silicon alloy melts at 366° C., subsequent operations on the sandwich involving heating preferably must not exceed or even get close to this temperature if damage to the sandwich is to be avoided. When the gold-antimony solder is used to form a P-N junction in a body of silicon semiconductor material, of course this temperature should not be exceeded or even approached; however, when the gold-antimony solder is used for making a non-rectifying connection to the semiconductor material, this temperature may be exceeded up to any other critical temperature in the sandwich, such as the temperature of formation of the aluminum alloy junction described above. We have found that a gold-tin solder or alloy consisting of approximately eighty percent gold and twenty percent tin is very well suited for securing the sandwich to external leads. Gold and tin have a eutectic point at approximately these percentages of gold and tin corresponding to a temperature of 280° C. It will be appreciated that these percentages may vary in either direction about the eutectic point. In the general case where higher temperatures are utilizable, percentages other than eutectic percentages may be used. It has been found that the constituents of the phase of the gold-tin system represented by the above percentages has unusually desirable properties at lower temperatures than conventional hard solders which have higher melting temperatures. The gold-tin solder described retains its hardness at temperatures only slightly lower than the eutectic temperature of 280° C.; and, accordingly, this solder is able to withstand thermal cycling much better than conventional soft solders.

Continuing now with the materials description of FIGURE 2 and FIGURE 3, disc 36 of a gold-tin laminate of the weight percentage mentioned above having a diameter of .312 inch and a thickness of .004 inch is situated on top of the tungsten backing plate 13. The laminate consists of tin clad with gold on both sides. It will, of course, be appreciated that tin-clad gold could be used as well as other forms, such as a cast gold-tin alloy. Over the disc is situated a strap member 23. Below the tungsten plate is also situated a disc 37 of a gold-tin laminate of the weight percentage mentioned above having a diameter of .375 inch and a thickness of .004 inch. Below the disc is situated copper stud 16 which supports the entire structure described above. The fabricated rectifying sandwich with the additional materials described is now again passed through a tunnel oven, the peak temperature of which is about 320° C. The latter temperature is chosen to be greater than the eutectic temperature of the gold-tin solder, yet sufficiently lower than the melting temperature of the gold-animony-silicon alloy (366° C.) to avoid damage of the sandwich. A temperature difference of about 40° C. has been found satisfactory. It takes about fifteen minutes for the sandwich and supporting structure to be elevated from room temperature to the peak temperature. The sandwich is held at the peak temperature for about three minutes and then is cooled to room temperature in about fifteen minutes. In this operation the tungsten backing plates 13 and 15 are secured to the external connections 23 and 16. Thereafter, the sandwich and supporting structure is housed and completed in the manner described above. Of course, if desired, the elements of the sandwich may be etched and treated by techniques well known in the art prior to complete assembly of the rectifier.

Since other modifications varied to fit particular operating requirements and environments will be apparent to those skilled in the art, the gold-tin solder may be used to perform a similar function, and its peculiar properties taken advantage of, to that described in semiconductor devices utilizing other materials than those described and fabricated in other ways. For example, it could be used with compound semiconductor materials and it also could be used with P-N junction devices made by a diffusion process. Accordingly, the invention is not considered limited to the examples chosen for the purposes of disclosure and covers all changes and modifications which do not constitute departures from the true spirit and scope of this invention.

What we claim as new and desire to secure by Letters Patent of the United States is:

1. In combination in a semiconductor device, a contact member, a body of semiconductor material, solder means securing said semiconductor material to said contact member, a mounting member, said contact member fused to said mounting member with a solder of substantially eighty percent gold and twenty percent tin.

2. In combination in a semiconductor device, a contact member, a body of semiconductor material, solder means securing said semiconductor material to said contact member, a mounting member, said contact member fused to said mounting member with a solder of substantially eighty percent gold and twenty percent tin, the melting temperature of said gold-tin solder being lower than that of the material of said contact member, said body of semiconductor material and said solder means securing said semiconductor material to said contact member.

3. In combination in a semiconductor device, an active rectifying element including a body of silicon, a surface area metallic contact, solder means securing said surface area metallic contact to said body of silicon, said rectifying element including materials having a melting point higher than 280° C., means for mounting said rectifying element to a metallic mounting member of a solder of substantially eighty percent gold and twenty percent tin.

4. In combination in a semiconductor device, a contact member comprising a metal of the group consisting of molybdenum, tungsten and base alloys thereof, a body of silicon secured to said contact member with a solder consisting of gold-antimony, a conductive mounting member, said contact member fused to said mounting member with a solder of substantially eighty percent gold and twenty percent tin.

5. In combination in a semiconductor device, a contact member consisting of a metal having a coefficient of expansion comparable to the coefficient of expansion of silicon, a body of semiconductor material, solder means securing said semiconductor material to said contact member, a bore mounting member, said contact member fused to said base mounting member with a solder of substantially eighty percent gold and twenty percent tin, the melting temperatures of said gold-tin solder being lower than that of the material of said contact member, said body of semiconductor material and said solder means securing said semiconductor material to said contact member.

6. In combination in a rectifying device, a contact member comprising a metal of the group consisting of molybdenum, tungsten and base alloys thereof, a body of silicon semiconductor material fused to said contact member with a solder consisting of gold-antimony, a base mounting member, said contact member fused to said base mounting member with a solder of substantially eighty percent gold and twenty percent tin, a second contact member fused to said body in silicon with aluminum, a second mounting member, said second contact member fused to said second base mounting member with a solder consisting essentially of eighty percent gold and twenty percent tin.

References Cited in the file of this patent

UNITED STATES PATENTS

| | | |
|---|---|---|
| 2,784,300 | Zuk | Mar. 5, 1957 |
| 2,921,245 | Wallace et al. | Jan. 12, 1960 |
| 2,982,892 | Bender et al. | May 2, 1961 |
| 3,004,168 | Emeis | Oct. 10, 1961 |
| 3,064,341 | Masterson | Nov. 20, 1962 |

UNITED STATES PATENT OFFICE

CERTIFICATE OF CORRECTION

Patent No. 3,160,798 December 8, 1964

William F. Lootens et al.

It is hereby certified that error appears in the above numbered patent requiring correction and that the said Letters Patent should read as corrected below.

Column 4, line 4, for "gold-animony-silicon" read -- gold-antimony-silicon --; line 74, for "bore" read -- base --; column 6, line 1, for "in silicon" read -- of silicon --.

Signed and sealed this 13th day of April 1965.

(SEAL)
Attest:

ERNEST W. SWIDER
Attesting Officer

EDWARD J. BRENNER
Commissioner of Patents